US012765141B2

(12) United States Patent
Chiang et al.

(10) Patent No.: US 12,765,141 B2
(45) Date of Patent: Oct. 13, 2026

(54) DISPLAY APPARATUS

(71) Applicant: AUO Corporation, Hsinchu (TW)

(72) Inventors: Hsin Chiang Chiang, Hsinchu (TW); Pao-Yu Huang, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 548 days.

(21) Appl. No.: 18/451,814

(22) Filed: Aug. 17, 2023

(65) Prior Publication Data

US 2024/0339574 A1 Oct. 10, 2024

(30) Foreign Application Priority Data

Apr. 6, 2023 (TW) ................................ 112112953

(51) Int. Cl.

| | |
|---|---|
| ***H01L 33/60*** | (2010.01) |
| ***H10H 20/856*** | (2025.01) |
| ***H10W 90/00*** | (2026.01) |

(52) U.S. Cl.

CPC .......... *H10H 20/856* (2025.01); *H10W 90/00* (2026.01)

(58) Field of Classification Search

CPC ............... H10H 20/856; H10H 29/142; H10H 20/8514; H10H 20/852; H10H 20/855; H10W 90/00; G09F 9/33; H10D 86/40; H10D 86/60

See application file for complete search history.

(56) References Cited

U.S. PATENT DOCUMENTS

| | | | |
|---|---|---|---|
| 10,622,523 | B2 | 4/2020 | Herrmann |
| 10,672,347 | B2 | 6/2020 | Chen |
| 11,705,544 | B2 | 7/2023 | Kim et al. |
| 2016/0372514 | A1 | 12/2016 | Chang et al. |
| 2018/0158847 | A1 | 6/2018 | Chang et al. |
| 2018/0309030 | A1 | 10/2018 | Herrmann |
| 2019/0114974 | A1 | 4/2019 | Chen |
| 2021/0408104 | A1 | 12/2021 | Lee et al. |
| 2022/0123183 | A1 | 4/2022 | Kim et al. |

(Continued)

FOREIGN PATENT DOCUMENTS

| | | |
|---|---|---|
| CN | 107680960 | 2/2018 |
| CN | 107750402 | 3/2018 |
| CN | 107894678 | 4/2018 |

(Continued)

*Primary Examiner* — Elmito Breval
(74) *Attorney, Agent, or Firm* — JCIPRNET

(57) ABSTRACT

A display apparatus includes a driving circuit substrate, a plurality of light emitting devices, a filler, a color filter substrate, a first bank layer, a plurality of color conversion patterns, and a plurality of reflective structures. The light emitting devices are disposed on the driving circuit substrate. The filler is disposed on the light emitting devices. The color filter substrate is disposed opposite to the driving circuit substrate. The first bank layer is located between the color filter substrate and the filler. The color conversion patterns are respectively disposed in a plurality of openings of the first bank layer. The reflective structures are disposed on the driving circuit substrate and located between the light emitting devices and the driving circuit substrate. Each reflective structure has a reflective concave surface caved toward the driving circuit substrate. A reflectivity of the reflective structure falls within a range from 95% to 98%.

13 Claims, 6 Drawing Sheets

(56) References Cited

U.S. PATENT DOCUMENTS

| | | | | |
|---|---|---|---|---|
| 2022/0367424 | A1 * | 11/2022 | Im | H10W 90/00 |
| 2023/0335694 | A1 | 10/2023 | Kim et al. | |

FOREIGN PATENT DOCUMENTS

| | | |
|---|---|---|
| CN | 108037612 | 5/2018 |
| CN | 109683390 | 4/2019 |
| CN | 113296315 | 8/2021 |
| CN | 112133811 | 3/2022 |
| CN | 114388550 | 4/2022 |
| TW | 201701458 | 1/2017 |

* cited by examiner

DISPLAY APPARATUS

CROSS-REFERENCE TO RELATED APPLICATION

This application claims the priority benefit of Taiwan application serial no. 112112953, filed on Apr. 6, 2023. The entirety of the above-mentioned patent application is hereby incorporated by reference herein and made a part of this specification.

BACKGROUND

Technical Field

The disclosure relates to a photoelectric apparatus; more particularly, the disclosure relates to a display apparatus.

Description of Related Art

A flat display device has advantages of being compact and small in volume and having a light weight and therefore has been widely used in daily lives. The flat display device includes a driving circuit substrate, a plurality of light emitting devices electrically connected to the driving circuit substrate, and a color filter substrate disposed opposite to the driving circuit substrate. The color filter substrate includes a light shielding pattern layer and a plurality of color filter patterns, where the light shielding pattern layer has a plurality of pixel openings overlapped with the light emitting devices, and the color filter patterns are disposed in the pixel openings. The flat display device may further include a plurality of color conversion patterns respectively overlapped with the light emitting devices to enhance color saturation. To avoid a light mixture issue, the flat display device is further equipped with a bank layer that separates the color conversion patterns. However, a portion of a light beam emitted by the light emitting devices is transmitted to and absorbed by the bank layer, thus resulting in a decrease in an optical efficiency of the flat display device.

SUMMARY

The disclosure provides a display apparatus with a high optical efficiency.

According to an embodiment of the disclosure, a display apparatus including a driving circuit substrate, a plurality of light emitting devices, a filler, a color filter substrate, a first bank layer, a plurality of color conversion patterns, and a plurality of reflective structures is provided. The light emitting devices are disposed on and electrically connected to the driving circuit substrate. The filler is disposed on the light emitting devices. The color filter substrate is disposed opposite to the driving circuit substrate and has a plurality of color filter patterns, and the color filter patterns are overlapped with the light emitting devices. The first bank layer is located between the color filter substrate and the filler. The first bank layer has a plurality of openings respectively overlapped with the color filter patterns and a body defining the openings. The color conversion patterns are respectively disposed in the openings of the first bank layer. The reflective structures are disposed on the driving circuit substrate and located between the light emitting devices and the driving circuit substrate. Each of the reflective structures has a reflective concave surface that is caved toward the driving circuit substrate. A reflectivity of the reflective structures falls within a range from 95% to 98%.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
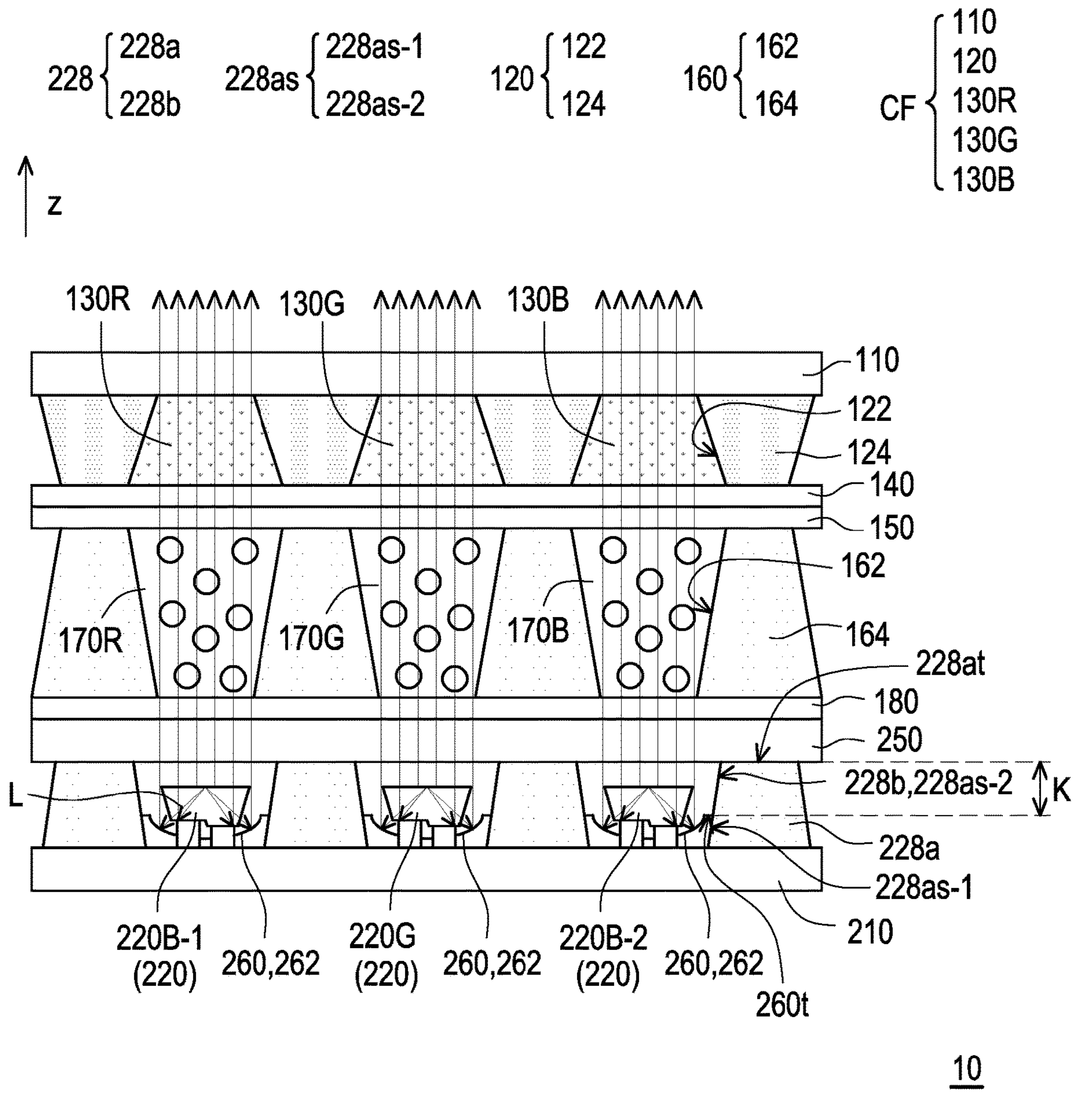
FIG. 1 is a schematic cross-sectional view of a display apparatus according to an embodiment of the disclosure.

Reference will now be made in detail to the exemplary embodiments of the disclosure, and examples of the exemplary embodiments are illustrated in the accompanying drawings. Whenever possible, the same reference numbers are used in the drawings and descriptions to indicate the same or similar parts.

It should be understood that when a device, such as a layer, a film, a region, or a substrate is referred to as being "on" or "connected to" another device, it can be directly on or connected to the another device, or an intermediate device may also be present. By contrast, when a device is referred to as being "directly on" or "directly connected to" another device, no intermediate device is present. As used herein, being "connected" may refer to a physical and/or electrical connection. Furthermore, being "electrically connected" or "coupled" may refer to the presence of other devices between the two devices.

The terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within +30%, +20%, +10%, or +5%. Furthermore, the terminology "about," "approximately," or "substantially" as used herein may be chosen from a range of acceptable deviations or standard deviations depending on the optical properties, etching properties, or other properties, rather than one standard deviation for all properties.

Unless otherwise defined, all terminologies (including technical and scientific terminologies) used herein have the same meaning as commonly understood by people having ordinary skill in the art to which the disclosure belongs. It is understood that these terminologies, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

FIG. 1 is a schematic cross-sectional view of a display apparatus according to an embodiment of the disclosure. With reference to FIG. 1, a display apparatus 10 includes a driving circuit substrate 210. For instance, in an embodiment, the driving circuit substrate 210 may include a base (not shown), a plurality of pixel driving circuits (not shown) disposed on the substrate, and a plurality of pad groups (not shown) electrically connected to the pixel driving circuits, which should however not be construed as a limitation in the disclosure.

The display apparatus 10 further includes a plurality of light emitting devices 220 disposed on and electrically connected to the driving circuit substrate 210. For instance, in an embodiment, the light emitting devices 220 may be a plurality of micro light emitting diodes (μLEDs), and a plurality of electrodes of each of the μLEDs may be electrically connected to a corresponding pad group of the pad groups, which should however not be construed as a limitation in the disclosure.

The display apparatus 10 further includes a filler 250 disposed on the light emitting devices 220. The display apparatus 10 further includes a color filter substrate CF. The color filter substrate CF is disposed opposite to the driving circuit substrate 210. The filler 250 is located between the color filter substrate CF and the light emitting devices 220. The color filter substrate CF has a plurality of color filter patterns 130R, 130G, and 130B, and the color filter patterns 130R, 130G, and 130B are overlapped with the light emitting devices 220.

In an embodiment, the color filter substrate CF may include a light transmitting substrate 110, a light shielding pattern layer 120, and the color filter patterns 130R, 130G, and 130B. Here, the light shielding pattern layer 120 is disposed on the light transmitting substrate 110, the light shielding pattern layer 120 includes a plurality of pixel openings 122 and a body 124 defining the pixel openings 122, and the color filter patterns 130R, 130G, and 130B are respectively disposed in the pixel openings 122 of the light shielding pattern layer 120. In an embodiment, a material of the light transmitting substrate 110 may include glass, quartz, an organic polymer, or any other appropriate material; the light shielding pattern layer 120 may be a black matrix, and a material of the black matrix may include black resin or any other appropriate material; the color filter patterns 130R, 130G, and 130B have different colors; the colors of the color filter patterns 130R, 130G, and 130B are, for instance, red, green, and blue, which should however not be construed as a limitation in the disclosure.

In an embodiment, the light emitting devices 220 may include light emitting devices 220B-1, 220G, and 220B-2, which serve to emit blue light, green light, and blue light, respectively. The light emitting devices 220B-1, 220G, and 220B-2 may be overlapped with the red color filter pattern 130R, the green color filter pattern 130G, and the blue color filter pattern 130B, respectively, which should however not be construed as a limitation in the disclosure.

The display apparatus 10 further includes a first bank layer 16 located between the color filter substrate CF and the filler 250. The first bank layer 160 has a plurality of openings 162 overlapped with the color filter patterns 130R, 130G, and 130B, respectively, and the first bank layer 160 has a body 164 defining the openings 162. The body 164 of the first bank layer 160 is overlapped with the body 124 of the light shielding pattern layer 120 of the color filter substrate CF. In an embodiment, a material of the first bank layer 160 may absorb light, which should however not be construed as a limitation in the disclosure.

The display apparatus 10 further includes a plurality of color conversion patterns 170R, 170G, and 170B disposed in the openings 162 of the first bank layer 160, respectively. The color conversion patterns 170R, 170B, and 170G may have photoluminescence (PL) materials with a single-layer structure or a multi-layer structure. The PL materials may include a phosphor material, a quantum dot (QD) material, a perovskite material, or any other appropriate PL material.

For instance, in an embodiment, the color conversion pattern 170R may include a QD material for generating a red-light wavelength; the color conversion patterns 170G and 170B may include transparent photoresist or a transparent flat layer and may not be doped with any QD material, and the color conversion patterns 170G and 170B may be optionally doped with scattering particles, which should however not be construed as a limitation in the disclosure. In an embodiment, the color conversion pattern 170R may convert a blue-light wavelength the red-light wavelength, the color conversion patterns 170G and 170B may allow incident light to directly penetrate, and the incident light penetrating the color conversion patterns 170R, 170G, and 170B may be red light, green light, and blue light, respectively, which should however not be construed as a limitation in the disclosure.

Note that the display apparatus 10 further includes a plurality of reflective structures 260 disposed on the driving circuit substrate 210 and located between the light emitting devices 220 and the driving circuit substrate 210. Each of the reflective structures 260 has a reflective concave surface 262, which is caved toward the driving circuit substrate 210. The reflective concave surfaces 262 of the reflective structures 260 are located between the light emitting devices 220 and the driving circuit substrate 210. A reflectivity of the reflective structures 260 falls within a range from 95% to 98%. In an embodiment of the disclosure, the reflectivity of the reflective structures 260 may fall within a range from 95% to 98%, which should however not be construed as a limitation in the disclosure.

The reflective structures 260 may serve as concave mirrors arranged below the light emitting devices 220. A part of a light beam L emitted by the light emitting devices 220 and transmitted toward the driving circuit substrate 210 may be reflected by the reflective concave surfaces 262 and transmitted in a more collimated manner toward the color filter substrate CF. Since the light beam L is more collimated after being reflected by the reflective concave surfaces 262, the proportion of the light beam L that passes through the first bank layer 160 and is then emitted may increase. Thereby, the optical efficiency of the display apparatus 10 may be improved.

Figure 2:
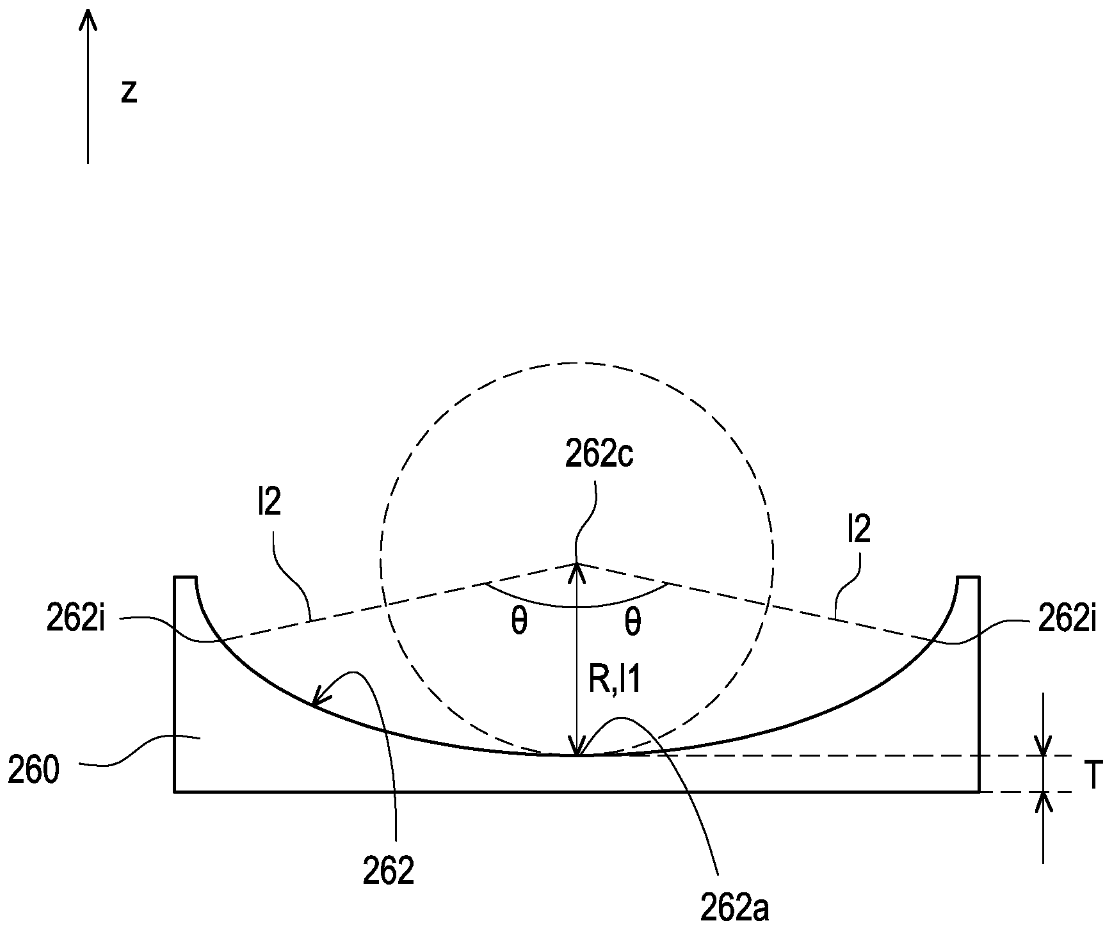
FIG. 2 is a schematic enlarged view of a reflective structure according to an embodiment of the disclosure.

FIG. 2 is a schematic enlarged view of a reflective structure according to an embodiment of the disclosure. With reference to FIG. 1 and FIG. 2, the reflective concave surface 262 of the reflective structure 260 has a lowest point 262*a* closest to the driving circuit substrate 210. A z direction is perpendicular to the base (not shown) of the driving circuit substrate 210. A minimum thickness T of the reflective structure 260 refers to a distance from the lowest point 262*a* of the reflective concave surface 262 in the z direction to the driving circuit substrate 210. In an embodiment, the minimum thickness T of the reflective structure 260 may fall within a range from 2 μm to 4 μm, which should however not be construed as a limitation in the disclosure.

In an embodiment, the reflective concave surface 262 has a boundary 262*i* of a reflection range, a first reference line 11 passes through the lowest point 262*a* and is perpendicular to the base (not shown) of the driving circuit substrate 210, a second reference line 12 passes through a curvature center 262*c* of the reflective concave surface 262 and the boundary 262*i* of the reflection range, an included angle θ exists between the first reference line 11 and the second reference line 12, and the included angle θ is approximately 450. In an embodiment, a curvature radius R of the reflective concave surface 262 may fall within a range from 16 mm to 18 mm. In an embodiment, the curvature radius R of the reflective concave surface 262 is, for instance, 16 μm, which should however not be construed as a limitation in the disclosure. In an embodiment, at least one portion of the light emitting devices 220 falls on the curvature center 262*c*/the focus of the corresponding reflective concave surface 262. In an embodiment, a material of the reflective structure 260 includes epoxy resins, an ethylene compound, a benzoic acid, or a combination of at least two of the above materials. In an embodiment, the reflective structures 260 may be formed by performing an ink-jet printing (IJP) process and a heating process, which should however not be construed as a limitation in the disclosure.

With reference to FIG. 1, in an embodiment, the display apparatus 10 further includes a second bank layer 228 disposed on the driving circuit substrate 210 and located between the filler 250 and the driving circuit substrate 210. The second bank layer 228 has a plurality of openings 228*b* and a body 228*a*. The body 228*a* of the second bank layer 228 defines the openings 228*b* of the second bank layer 228, and the light emitting devices 220 and the reflective structures 260 are disposed in the openings 228*b* of the second bank layer 228.

In an embodiment, the body 228*a* of the second bank layer 228 has a sidewall 228*as*, the reflective structures 260 cover a first portion 228*as*-1 of the sidewall 228*as* close to the driving circuit substrate 210 and expose a second portion 228*as*-2 of the sidewall 228*as* away from the driving circuit substrate 210, which should however not be construed as a limitation in the disclosure.

In an embodiment, the body 228*a* of the second bank layer 228 has a top surface 228*at*, one of the reflective structures 260 has an end point 260*t* away from the driving circuit substrate 210, and the end point 260*t* is spaced from the top surface 228*at* of the second bank layer 228 by a distance K, which should however not be construed as a limitation in the disclosure.

In an embodiment, the openings 228*b* of the second bank layer 228 may be respectively overlapped with the color filter patterns 130R, 130G, and 130B, the light emitting devices 220B-1, 220G, and 220B-2 may be respectively overlapped with the color filter patterns 130R, 130G, and 130B and are respectively disposed in the openings 228*b* of the second bank layer 228, and the reflective structures 260 may be respectively overlapped with the color filter patterns 130R, 130G, and 130B and are respectively disposed in the openings 228*b* of the second bank layer 228, which should however not be construed as a limitation in the disclosure.

In an embodiment, the filler 250 is disposed between the first bank layer 160 and the second bank layer 228, where the filler 250 is partially overlapped with the reflective structures 260.

In an embodiment, the display apparatus 10 further includes a first insulation layer 180 located between the first bank layer 160 and the filler 250 and between the color conversion patterns 170R, 170G, and 170B and the filler 250, where the first insulation layer 180 is partially overlapped with the reflective structures 260. In an embodiment, a material of the first insulation layer 180 may include silicon oxide ($S_iO_x$), which should however not be construed as a limitation in the disclosure.

In an embodiment, the display apparatus 10 further includes a second insulation layer 150 located between the color filter substrate CF and the first bank layer 160 and between the color filter substrate CF and the color conversion patterns 170R, 170G, and 170B, where the second insulation layer 150 is partially overlapped with the reflective structures 260. In an embodiment, a material of the second insulation layer 150 may include $S_iO_x$, which should however not be construed as a limitation in the disclosure.

In an embodiment, the display apparatus 10 further includes a protection layer 140 located between the color filter substrate CF and the second insulation layer 150, where the protection layer 140 is partially overlapped with the reflective structures 260. In an embodiment, a material of the protection layer 140 may include an organic material, which should however not be construed as a limitation in the disclosure.

It should be noted that reference numbers of the devices and a part of contents of the aforementioned embodiments are also used in the following embodiments, where the same reference numbers denote the same or like devices, and descriptions of the same technical contents are omitted. The aforementioned embodiments may be referred for descriptions of the omitted parts, and detailed descriptions thereof are not repeated in the following embodiments.

Figure 3:
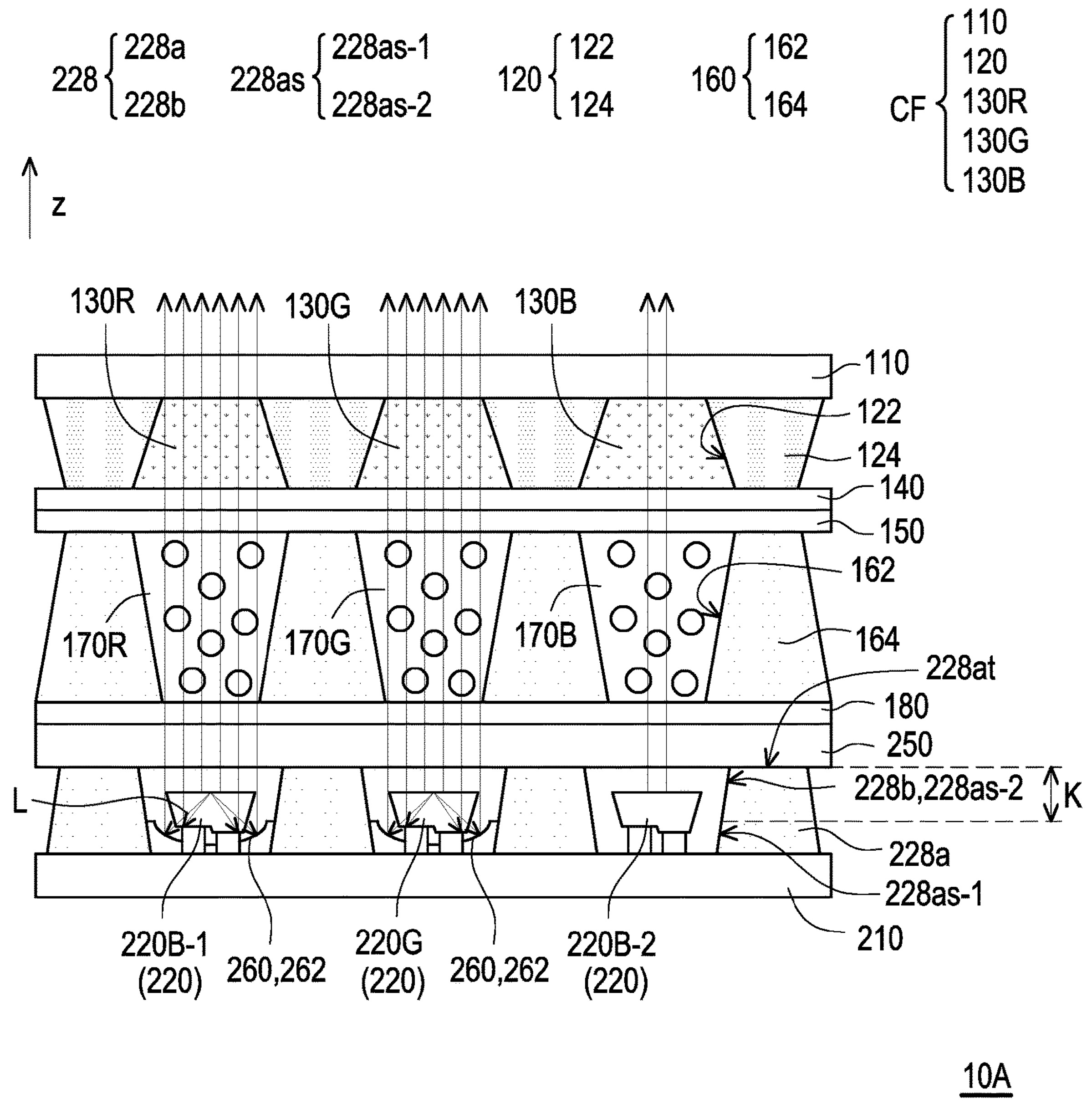
FIG. 3 is a schematic cross-sectional view of a display apparatus according to another embodiment of the disclosure.

FIG. 3 is a schematic cross-sectional view of a display apparatus according to another embodiment of the disclosure. A display apparatus 10A depicted in FIG. 3 is similar to the display apparatus 10 depicted in FIG. 1, and the differences therebetween are described below. With reference to FIG. 3, in this embodiment, the color filter patterns 130R, 130G, and 130B include the first color filter pattern 130R, the second color filter pattern 130G, and the third color filter pattern 130B. The reflective structures 260 are respectively overlapped with the first color filter pattern 130R and the second color filter pattern 130G and are staggered with the third color filter pattern 130B. In short, according to the embodiment depicted in FIG. 3, the brightness of the light emitting device 220B-2 overlapping the color filter pattern 130B is high, and thus the reflective structure 260 below the light emitting device 220B-2 may be omitted to protect the eyes of users.

Figure 4:
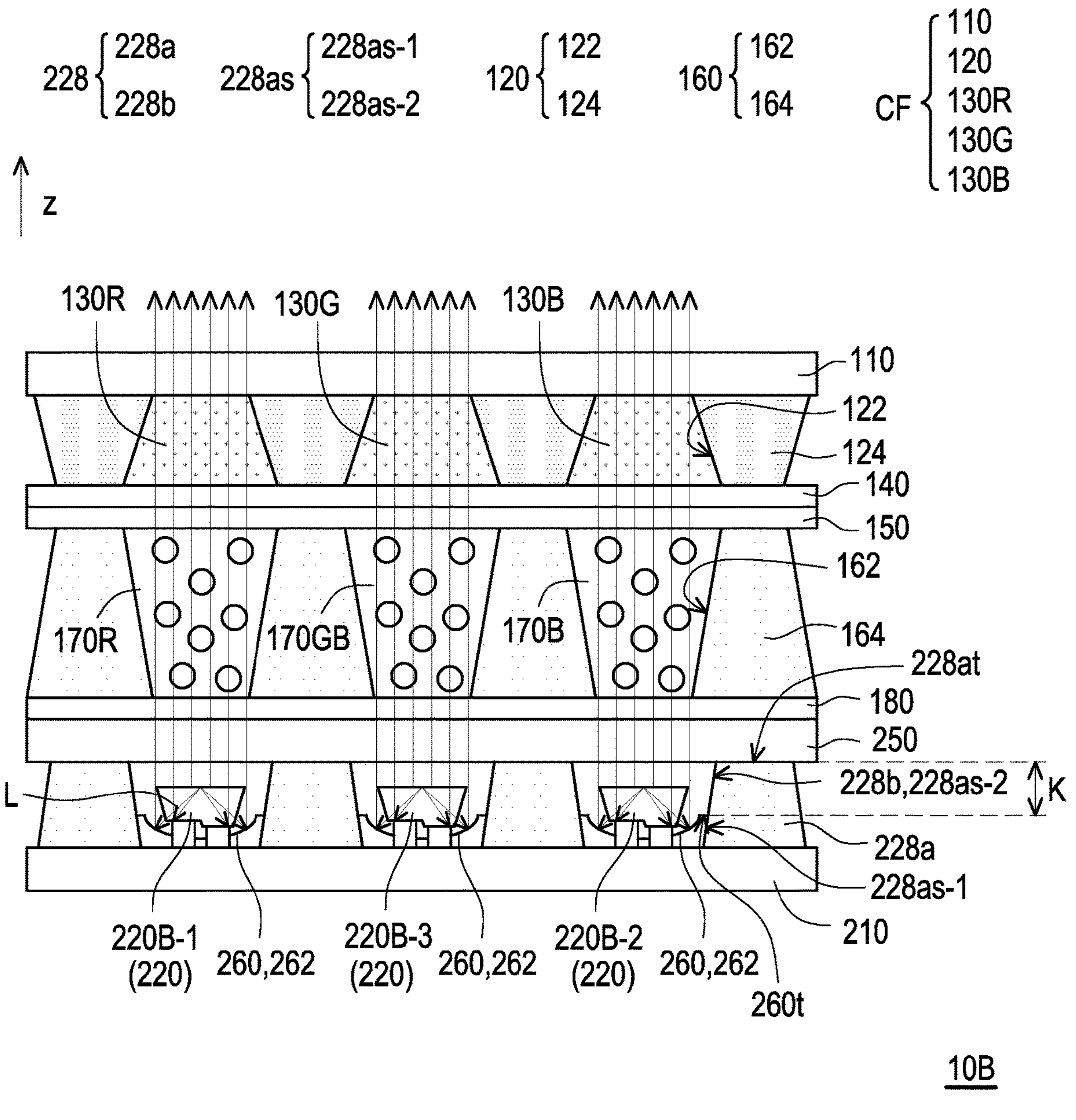
FIG. 4 is a schematic cross-sectional view of a display apparatus according to still another embodiment of the disclosure.

FIG. 4 is a schematic cross-sectional view of a display apparatus according to still another embodiment of the disclosure. A display apparatus 10B depicted in FIG. 4 is similar to the display apparatus 10 depicted in FIG. 1, and the differences therebetween lie in that: the light emitting device 220B-3 overlapping the green color filter pattern 130G in FIG. 4 is different from the light emitting device 220G overlapping the green color filter pattern 130G in FIG. 1, and the color conversion pattern 170*GB* overlapping the green color filter pattern 130G in FIG. 4 is different from the color conversion pattern 170G overlapping the green color filter pattern 130G in FIG. 1.

Specifically, in the embodiment shown in FIG. 4, the light emitting device 220B-3 overlapping the green color filter pattern 130G serves to emit blue light, and the color conversion pattern 170*GB* overlapping the green color filter pattern 130G may include a QD material for generating a green-light wavelength. The color conversion pattern 170*GB* may convert the blue-light wavelength into the green-light wavelength.

Figure 5:
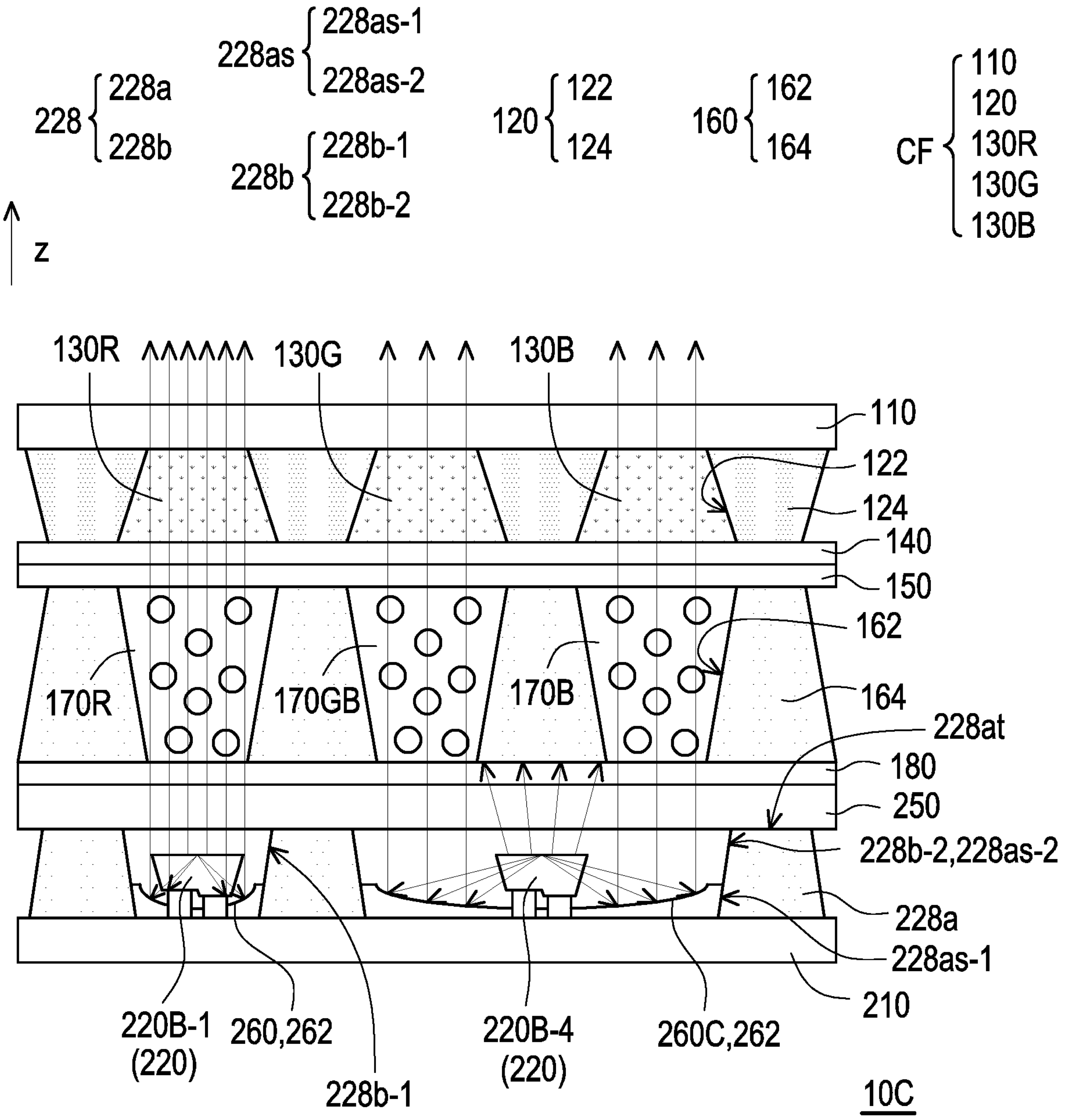
FIG. 5 is a schematic cross-sectional view of a display apparatus according to yet another embodiment of the disclosure.

FIG. 5 is a schematic cross-sectional view of a display apparatus according to yet another embodiment of the disclosure. A display apparatus 10C depicted in FIG. 5 is similar to the display apparatus 10B depicted in FIG. 4, and the differences therebetween are described below.

With reference to FIG. 5, in this embodiment, the color filter patterns 130R, 130G, and 130B include the first color filter pattern 130R, the second color filter pattern 130G, and the third color filter pattern 130B. The openings 228*b* of the second bank layer 228 include a first opening 228*b*-1 and a second opening 228*b*-2. The first opening 228*b*-1 of the second bank layer 228 is overlapped with the first color filter pattern 130R, and the second opening 228*b*-2 of the second bank layer 228 is overlapped with the second color filter pattern 130G and the third color filter pattern 130B. The light emitting devices 220 include a first light emitting device 220B-1 and a second light emitting device 220B-4, and the first light emitting device 220B-1 and the second light emitting device 220B-4 are respectively disposed in the first opening 228*b*-1 and the second opening 228*b*-2 of the second bank layer 228.

In brief, in the embodiment shown in FIG. 5, the color conversion patterns 170*GB* and 170B respectively overlapped with the second color filter pattern 130G of the green color and the third color filter pattern 130B of the blue color share the same second light emitting device 220B-4 and the reflective structure 260C. In this embodiment, both the first light emitting device 220B-1 and the second light emitting device 220B-4 serve to emit blue light. In an embodiment, a light emitting wavelength of the shared second light emitting device 220B-4 may be optionally shorter than a light emitting wavelength of the first light emitting device 220B-1, thereby increasing the light conversion efficiency. For instance, in an embodiment, at least one portion of the light emitting wavelength of the first light emitting device 220B-1 may fall within a range from 450 nm to 490 nm, while at least one portion of the light emitting wavelength of the second light emitting device 220B-4 may fall within a range from 440 nm to 450 nm.

Figure 6:
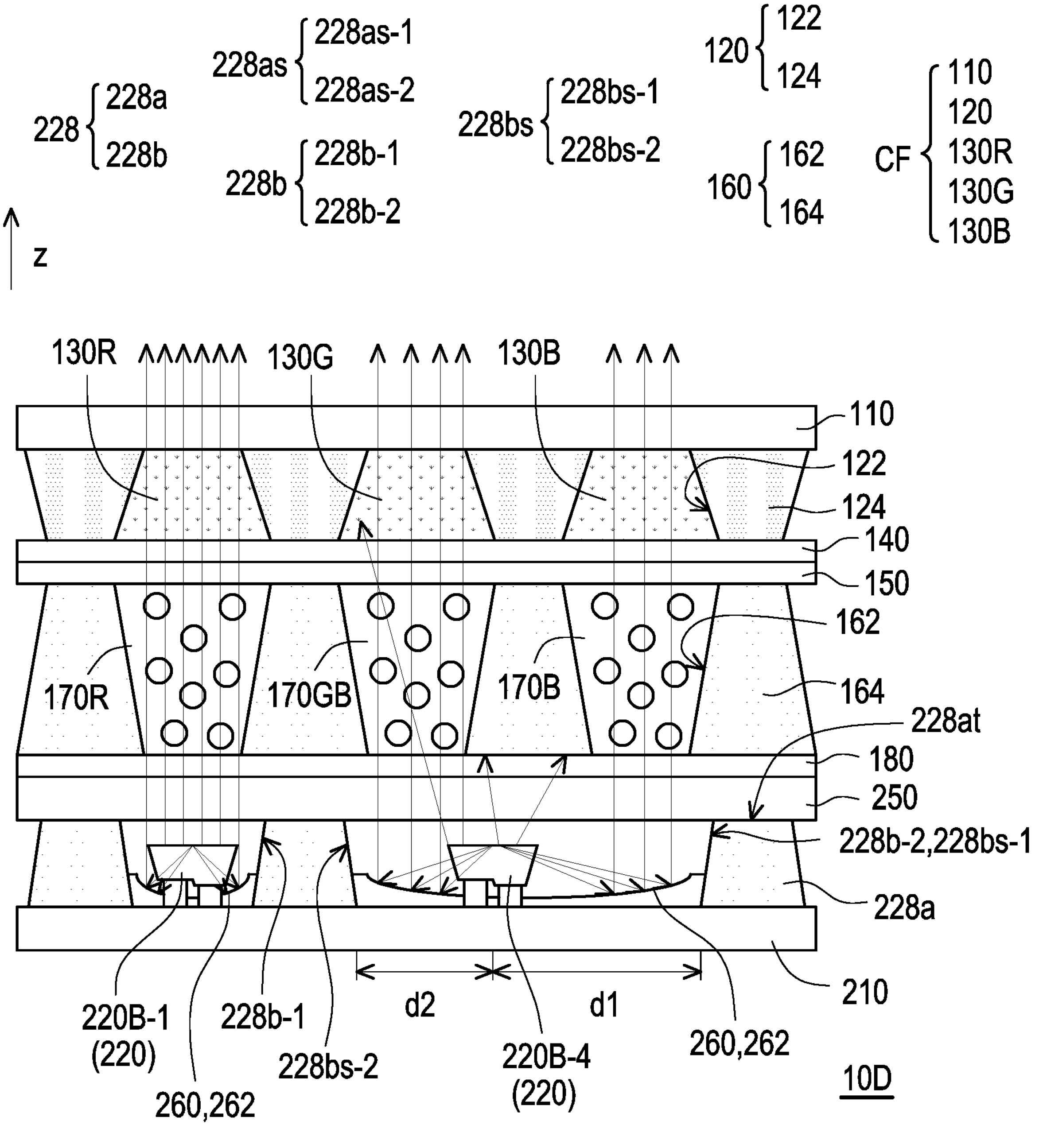
FIG. 6 is a schematic cross-sectional view of a display apparatus according to an embodiment of the disclosure.

FIG. 6 is a schematic cross-sectional view of a display apparatus according to an embodiment of the disclosure. A display apparatus 10D depicted in FIG. 6 is similar to the display apparatus 10C depicted in FIG. 5, and the differences therebetween are described below.

With reference to FIG. 6, in this embodiment, the body 228*a* of the second bank layer 228 has a sidewall 228*bs* defining the second opening 228*b*-2. The sidewall 228*bs* includes a first sub-sidewall 228*bs*-1 and a second sub-sidewall 228*bs*-2, which are opposite to each other. ○The first sub-sidewall 228*bs*-1 corresponds to the blue color filter pattern 130B, and the second sub-sidewall 228*bs*-2 corresponds to the green color filter pattern 130G. The second light emitting device 220B-4 is spaced from the first sub-sidewall 228*bs*-1 by a first distance d1 and spaced from the second sub-sidewall 228*bs*-2 by a second distance d2, and the first distance d1 is greater than the second distance d2. In short, in the embodiment depicted in FIG. 6, the second light emitting device 220B-4 is located relatively below the green color filter pattern 130G and away from the bottom of the blue color filter pattern 130B.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:

a driving circuit substrate;

a plurality of light emitting devices, disposed on the driving circuit substrate and electrically connected to the driving circuit substrate;

a filler, disposed on the light emitting devices;

a color filter substrate, disposed opposite to the driving circuit substrate and having a plurality of color filter patterns, wherein the color filter patterns are overlapped with the light emitting devices;

a first bank layer, located between the color filter substrate and the filler, wherein the first bank layer has a plurality of openings respectively overlapped with the color filter patterns and a body defining the openings;

a plurality of color conversion patterns, respectively disposed in the openings of the first bank layer;

a plurality of reflective structures, disposed on the driving circuit substrate and located between the light emitting devices and the driving circuit substrate, wherein a plurality of electrodes of each of the light emitting devices contact corresponding one of the reflective structures, the material of each of the reflective structures comprises epoxy resins, an ethylene compound, a benzoic acid, or a combination of at least two of the above materials, and a reflectivity of the reflective structures falls within a range from 95% to 98%, wherein each of the reflective structures has:

a reflective concave surface caved toward the driving circuit substrate and having a boundary of a reflection range; and a lowest point closest to the driving circuit substrate, wherein a first reference line passes through the lowest point and is perpendicular to a base of the driving circuit substrate, a second reference line passes through a curvature center of the reflective concave surface and the boundary of the reflection range, an included angle exists between the first reference line and the second reference line, the included angle is approximately 45°, and at least one portion of one of the light emitting devices falls on and overlaps the curvature center of the reflective concave surface.

2. The display apparatus according to claim 1, wherein a minimum thickness of the reflective structures falls within a range from 2 μm to 4 μm.

3. The display apparatus according to claim 1, wherein a curvature radius of the reflective concave surface falls within a range from 16 mm to 18 mm.

4. The display apparatus according to claim 1, further comprising:

a second bank layer, disposed on the driving circuit substrate and located between the filler and the driving circuit substrate, wherein the second bank layer has a plurality of openings and a body, the body of the second bank layer defines the openings of the second bank layer, and the light emitting devices and the curvature centers of the reflective concave surfaces of the reflective structures are completely disposed within corresponding openings of the second bank layer.

5. The display apparatus according to claim 4, wherein the body of the second bank layer has a sidewall, and the reflective structures cover a first portion of the sidewall close to the driving circuit substrate and expose a second portion of the sidewall away from the driving circuit substrate.

6. The display apparatus according to claim 4, wherein the body of the second bank layer has a top surface, one of the reflective structures has an end point away from the driving circuit substrate, and the end point of the one of the reflective structures is spaced from the top surface of the second bank layer by a distance.

7. The display apparatus according to claim 4, wherein the filler is disposed between the first bank layer and the second bank layer, and the filler is partially overlapped with the reflective structures.

8. The display apparatus according to claim 7, further comprising:

a first insulation layer, located between the first bank layer and the filler and between the color conversion patterns and the filler, wherein the first insulation layer is partially overlapped with the reflective structures.

9. The display apparatus according to claim 1, further comprising:

a second insulation layer, located between the color filter substrate and the first bank layer and between the color filter substrate and the color conversion patterns, wherein the second insulation layer is partially overlapped with the reflective structures.

10. The display apparatus according to claim 9, further comprising:

a protection layer, located between the color filter substrate and the second insulation layer, wherein the protection layer is partially overlapped with the reflective structures.

11. The display apparatus according to claim 1, wherein the color filter patterns comprise a first color filter pattern, a second color filter pattern, and a third color filter pattern, and the reflective structures are respectively overlapped with the first color filter pattern and the second color filter pattern and are staggered with the third color filter pattern.

12. The display apparatus according to claim 1, further comprising:

a second bank layer, disposed on the driving circuit substrate and located between the filler and the driving circuit substrate, wherein the second bank layer has a plurality of openings and a body, the body of the second bank layer defines the openings of the second bank layer, and the light emitting devices and the reflective structures are disposed in the openings of the second bank layer, wherein the color filter patterns comprise a first color filter pattern, a second color filter pattern, and a third color filter pattern, wherein the openings of the second bank layer comprise a first opening and a second opening, the first opening of the second bank layer is overlapped with the first color filter pattern along a z direction perpendicular to the base of the driving circuit substrate, the second opening of the second bank layer is overlapped with both of the second color filter pattern and the third color filter pattern along the z direction, the light emitting devices comprise a first light emitting device and a second light emitting device, the first light emitting device and the second light emitting device are respectively disposed in the first opening and the second opening of the second bank layer, a light emitting wavelength of the second light emitting device is shorter than a light emitting wavelength of the first light emitting device, and the reflective concave surface of one of the reflective structures in the second opening of the second bank layer is overlapped with both of the second color filter pattern and the third color filter pattern along the z direction.

13. The display apparatus according to claim 12, wherein the body of the second bank layer has a sidewall defining the second opening, the sidewall comprises a first sub-sidewall and a second sub-sidewall opposite to each other, the second light emitting device is spaced from the first sub-sidewall by a first distance, the second light emitting device is spaced from the second sub-sidewall by a second distance, the first distance is greater than the second distance, and the light emitting wavelength of the first light emitting device falls within a range from 450 nm to 490 nm and the light emitting wavelength of the second light emitting device falls within a range from 440 nm to 450 nm.

* * * * *